United States Patent [19]

Tolt et al.

[11] Patent Number: 5,045,528

[45] Date of Patent: * Sep. 3, 1991

[54] ACOUSTIC PLANE WAVE PREFERENTIAL ORIENTATION OF METAL OXIDE SUPERCONDUCTING MATERIALS

[75] Inventors: Thomas L. Tolt, North Olmsted, Ohio; Roger B. Poeppel, Glen Ellyn, Ill.

[73] Assignee: ARCH Development Corporation, Argonne, Ill.

[*] Notice: The portion of the term of this patent subsequent to Nov. 27, 2007 has been disclaimed.

[21] Appl. No.: 101,819

[22] Filed: Sep. 28, 1987

[51] Int. Cl.$^5$ ............................................. H01L 39/12
[52] U.S. Cl. ......................................... 505/1; 264/23; 264/24; 264/56; 264/108; 505/740; 505/741
[58] Field of Search ..................... 264/23, 24, 56, 63, 264/28, 86, 108, 109, 118, 125, 115, 140; 252/518, 521; 505/1, 822, 823, 740, 741, 739

[56] References Cited

U.S. PATENT DOCUMENTS 2,384,215  9/1945  Toulmin ............................... 264/24
3,041,670  7/1962  Broderson ............................ 264/23
4,762,754  8/1988  Nellis et al. ........................... 428/552

OTHER PUBLICATIONS

Takita et al., "Studies on Anisotropic Upper Critical Fields of $HoBa_2Cu_3O_{7-\delta}$ and $ErBa_2Cu_3O_{7-\delta}$ Using Preferentially Oriented Pellets", Jap. J. App. Phys., vol. 26, No. 9, Sep. 1987, pp. L1552–L1554.

Poeppel et al., "Fabrication of $YBa_2Cu_3O_7$ Superconducting Ceramics", ACS Symposium Series 351, pp. 261–265, Aug. 30–Sep. 4, 1987.

Primary Examiner—Mary Lynn Theisen
Attorney, Agent, or Firm—Emrich & Dithmar

[57] ABSTRACT

A polycrystalline metal oxide such as $YBa_2Cu_3O_{7-X}$ (where $0<X<0.5$) exhibits superconducting properties and is capable of conducting very large current densities. By aligning the two-dimensional Cu-O layers which carry the current in the superconducting state in the a- and b-directions, i.e., within the basal plane, a high degree of crystalline axes alignment is provided between adjacent grains permitting the conduction of high current densities. With the superconducting metal oxide in the form of a ceramic slip which has not yet set, orientation of the crystal basal planes parallel with the direction of desired current flow is accomplished by an applied acoustic plane wave in the acoustic or ultrasonic frequency range (either progressive or standing) in applying a torque to each crystal particle. The ceramic slip is then set and fired by conventional methods to produce a conductor with preferentially oriented grains and substantially enhanced current carrying capacity.

13 Claims, 2 Drawing Sheets

ACOUSTIC PLANE WAVE PREFERENTIAL ORIENTATION OF METAL OXIDE SUPERCONDUCTING MATERIALS

CONTRACTUAL ORIGIN OF THE INVENTION

This invention was made with Government support under Contract Number W-31-109-ENG-38 awarded by the United States Department of Energy. The Government has certain rights in the invention.

BACKGROUND OF THE INVENTION

This invention relates generally to the fabrication of superconducting materials and is particularly directed to the orientation of the crystals of a polycrystalline superconducting metal oxide material in a preferred direction using an acoustic plane wave for increasing its current carrying capacity.

Certain metals, alloys, and chemical compounds known as superconductors exhibit zero electrical resistivity and complete diamagnetism at very low temperatures and magnetic fields. The transition of a metal from normal electrical conducting properties to superconducting properties depends primarily on (1) the temperature and (2) the magnetic field at the surface of the metal. The superconductive state of the metal exists for temperatures less than its characteristic critical temperature, $T_c$. The most practical superconducting materials exhibit very low critical temperatures, i.e., on the order of 4-23 K. However, recent developments have produced new superconducting materials, based on oxides, having critical temperatures on the order of 100 K.

Superconductors also exhibit a characteristic critical electric current density, $J_c$, measured in amps/cm$^2$. By increasing the current density in a superconducting material to its $J_c$ characteristic value, it can be driven into a normal conducting state. Thus, the current density at which this transition occurs is termed the conductive material's critical current density. It is of course desirable for a superconductor to have a high critical current density to allow it to conduct large currents while remaining superconductive.

In practical Type II superconductors efforts to increase the critical current density have involved the incorporation of microstructural defects in the material. A magnetic field applied to the superconductor penetrates the material in the form of small bundles; or vortices, of magnetic flux which can move about within the material as it conducts current. Movement of these magnetic vortices is a dissipative process characterized by resistive heating and thus represents a limitation in the material's current carrying capacity. Incorporation of the aforementioned microstructural defects within the material prevents the magnetic vortices from moving within the superconductor in response to current flowing therein. By preventing the movement of these magnetic vortices, the material's critical current density can be substantially increased before the material assumes normal, non-superconducting current conducting operation.

The class of metal oxide superconductors unfortunately exhibit very small critical current densities. For example, these materials typically have a critical current density in the presence of magnetic fields on the order of 5-10 amps/cm$^2$, while other practical superconductors typically are capable of supporting current densities on the order of 10,000-100,000 amps/cm$^2$. As a result, these metal oxide materials have heretofore been of limited use in superconducting applications. Recent investigations have indicated that low critical electric current density values are not an intrinsic problem with metal oxide superconductors, since single crystal, thin film metal oxide superconducting materials have been produced which are capable of supporting very large current densities.

The present invention addresses the aforementioned limitations of the prior art by providing for the fabrication of a superconducting material having a polycrystalline oxide structure of single crystals oriented in a preferred direction by means of acoustic plane waves incident on the material so as to provide the superconductor with a large critical current density value.

OBJECTS AND SUMMARY OF THE INVENTION

Accordingly, it is an object of the present invention to provide for the orientation of the crystals of a polycrystalline metal oxide superconductor in a preferential direction in order to substantially enhance its current-carrying characteristic.

Another object of the present invention is to provide for the alignment in a preferred direction of the crystals of a polycrystalline metal oxide superconductor which is in the form of a flake-like powder using acoustic plane waves of either a sonic or ultrasonic nature.

Yet another object of the present invention is to align the individual flake-like crystal particles of a superconducting material in the form of a ceramic slip using wave mechanics such that the c-axis of each of the crystals corresponding to its low $J_c$ direction is aligned parallel to the short dimension of the flake and the c-axes of virtually all of the crystal particles ar aligned in parallel to permit substantially increased current transport from grain to grain.

It is a further object of the present invention to apply a torque to the crystal particles of a metal oxide superconductor dispersed in a liquid in order to align the axes of the superconducting directions of the crystals and thus facilitate current transport between adjacent grains.

The present invention contemplates the orientation of the crystal axes of a metal oxide superconducting material in the form of a powder comprised of single crystal particles along preferential directions for increasing the critical current density of the superconducting material. Each of the superconducting crystal particles has an orthorhombic structure and is anisotropic in its superconducting characteristic such that the non-superconducting c-axis of the crystals is aligned parallel to the short dimension of the crystal particle. By applying an acoustic plane wave to the superconducting metal oxide dispersed in a liquid , the axes along which each of the crystal particles is superconducting may be aligned to facilitate current transport across grain boundaries. The present invention contemplates the use of either sonic or ultrasonic waves incident upon the dispersed superconducting metal oxide for substantially increasing its critical current density.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which.

DESCRIPTION OF THE PREFERRED EMBODIMENT

Figure 1:
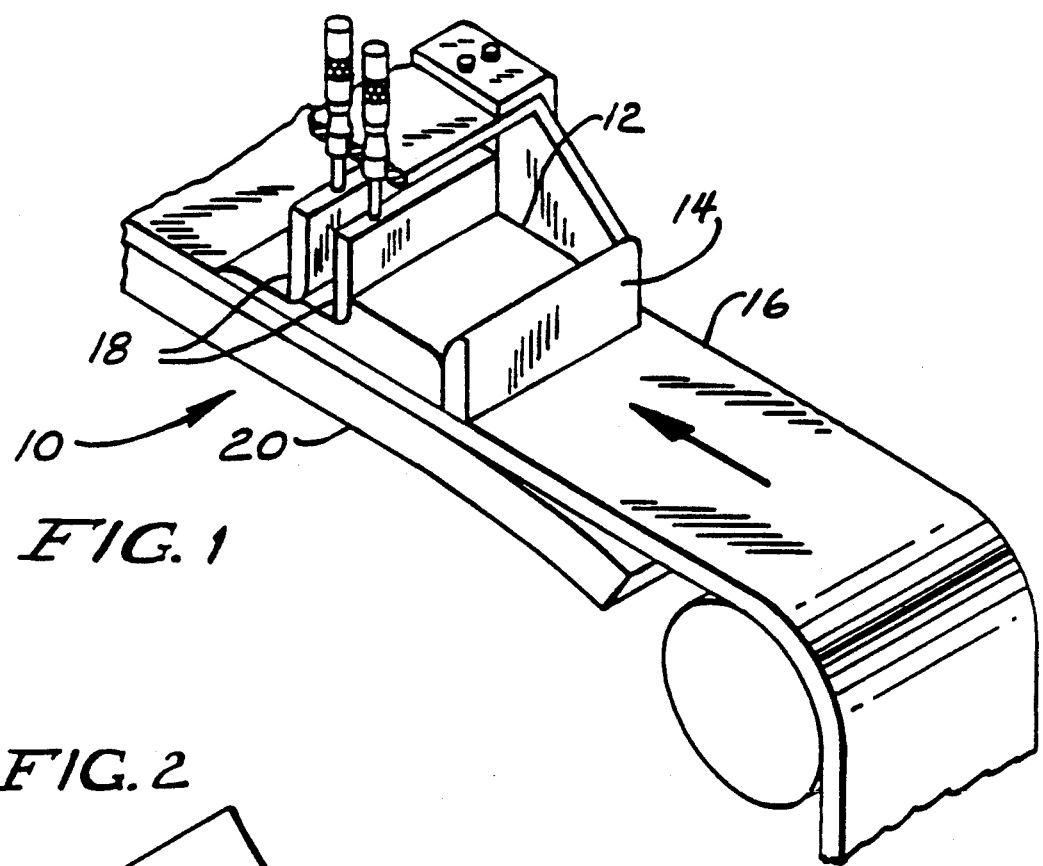
FIG. 1 is a simplified schematic diagram of a tape casting apparatus for use in the preferential orientation of the crystal particles of a metal oxide superconducting material in accordance with the present invention.

Initial measurements on polycrystalline samples of oxide superconductors such as $YBa_2Cu_3O_{7-X}$ (where $0<X<0.5$) have shown that the current carrying capacity of these materials is not large enough to allow these materials to serve in practical applications. For example, recent measurements have indicated that these materials are only capable of supporting current densities on the order of 100-1000 $amps/cm^2$ in zero magnetic field. This current carrying capacity is clearly inadequate from a practical standpoint when compared with critical current densities on the order of 10,000-100,000 $amps/cm^2$ generally available in other superconducting materials. In addition, these limited current densities observed in metal oxide superconductors of this type are substantially reduced (as much as 100 times less) by the application of relatively small magnetic fields. Recent work performed at International Business Machines (IBM) as described at the American Ceramic Society Meeting in Pittsburgh, Pa., in April 1987 indicates that this is not an intrinsic problem with these metal oxide superconducting materials, since textured, thin-film materials have been produced which are capable of supporting very large current densities ($>100,000$ $amps/cm^2$). The aforementioned IBM work further indicates that the a- and b-directions, i.e., within the basal plane, of the orthorhombic $YBa_2Cu_3O_{7-X}$ are capable of supporting on the order of 30-100 times the critical current density which can be achieved in the c-direction, i.e., normal to the basal plane.

The reason for this inability of bulk metal oxide superconductors to support the large current densities necessary in virtually all practical applications appears to be a lack of alignment between adjacent grains of $YBa_2Cu_3O_{7-X}$ which carry the current in the superconducting state. This lack of alignment between adjacent grains is believed to restrict current transport to that available only by means of Josephson tunnelling and thus represents a severe limitation on current handling capability in magnetic fields. Evidence to support this finding can be found in both the small current densities and the strong field dependence of the conductivity of these materials.

This problem is avoided in the present invention by orienting the crystalline axes of different grains of these metal oxide superconducting materials along common directions to facilitate current transport across these grain boundaries. Polycrystalline oxide superconductors in accordance with the present invention are comprised of particles each of which is essentially a single crystal and which may be synthesized by either (1) growing bulk single crystals and grinding these single crystals into a powder, or (2) carrying out long-term annealing of powder samples of these polycrystalline metal oxide materials at temperatures near the melting temperature in order to promote large single crystal grain growth, followed by the grinding of these materials into fine powders.

In one approach leading to the present invention, a metal oxide superconductor such as $YBa_2Cu_3O_{7-X}$ (where $0<X<0.5$) is provided in powder form using any one of several conventional methods well known to those skilled in the relevant arts. This polycrystalline powder is then pressed into a compact form such as in the shape of pellets by means of a hydrostatic press in a conventional manner. The compacted polycrystalline powder is then heated to a temperature on the order of its melting point, i.e., to a temperature in the range of 950°-1000° C. for yttrium barium copper oxide which has a melting point of approximately 1025° C. The metal oxide material is sintered at these high temperatures for an extended period of time, e.g., on the order of 20-60 hours, in order to induce large grain growth. After sintering the metal oxide material at the aforementioned temperatures for the stated period of time, grains on the order of 100 microns in diameter are produced in the compacted crystal structure.

The sintered, large grained metal oxide crystal structure is then ground to a powder comprised of single crystal particles. The thus formed superconducting powder has a flake-like morphology such that the c-axis of the individual crystals is aligned parallel to the short dimension of the disc-like flake. The metal oxide particles thus take on the general form of a flattened disc where the a- and b-directions are in the plane of the disc and the c-axis is oriented generally perpendicular to the plane of the disc. All of the crystal particles thus have generally the same orientation. Tapes and/or wires processed from these powders have the a- and b-directions of the crystal particles oriented along the planes of the Cu and O conducting layers throughout the bulk of the wire or tape and thus permit a large critical current to be conducted within the conductor. In grinding the superconducting crystals down to a size much less than the original grain size, the compact superconducting metal oxide material is cleaved along the crystal axes resulting in platelets, or small flat bodies having the aforementioned disc-like shape. The high critical current density axes of these platelets lies in the plane of its disc-like shape.

In order to improve grain growth, impurities may be added to the metal oxide crystal material to produce larger grained structures. The addition of barium cuprate ($BaCuO_2$) to the metal oxide crystal material provides an excess of barium oxide and copper oxide, which form a low temperature eutectic with a melting temperature of about 880° C. lower than the sintering temperatures used. The low melting points of the barium oxide and copper oxide eutectic allow for increased diffusion within the metal oxide powder mixture producing larger grain growth. The other approach referred to above in producing the metal oxide crystal powder, i.e., growing bulk single crystals and grinding them into a powder, may be accomplished by growing each crystal from a similar melt using a molten bath. The difference between the two techniques lies in the amount of second phases one wishes to tolerate. In the molten bath technique large amounts of second phase must be removed from the mixture in order to obtain the desired $YBa_2Cu_3O_{7-x}$ crystals.

After producing the metal oxide crystal powders in which the particles are predominantly single crystallites, various approaches may be taken to orient the crystal particles along common axes. For example, as shown in FIG. 1, a tape casting apparatus 10 may be used in aligning the crystal particles along common axes. In the tape casting apparatus 10, a slip 12, comprised of a suitable mixture of single crystal powder, binders and plasticizers, is spread onto a tempered glass bed or other suitable flat surface 20 with a doctor blade 18 which produces the desired thickness. As the slip is drawn beneath the doctor blade 18, the individual crystal particles contained within are oriented such that their c-axes are aligned generally perpendicular with the plane of the tape. This is due to the flake-like discs aligning parallel to the plane of the tape.

Figure 2:
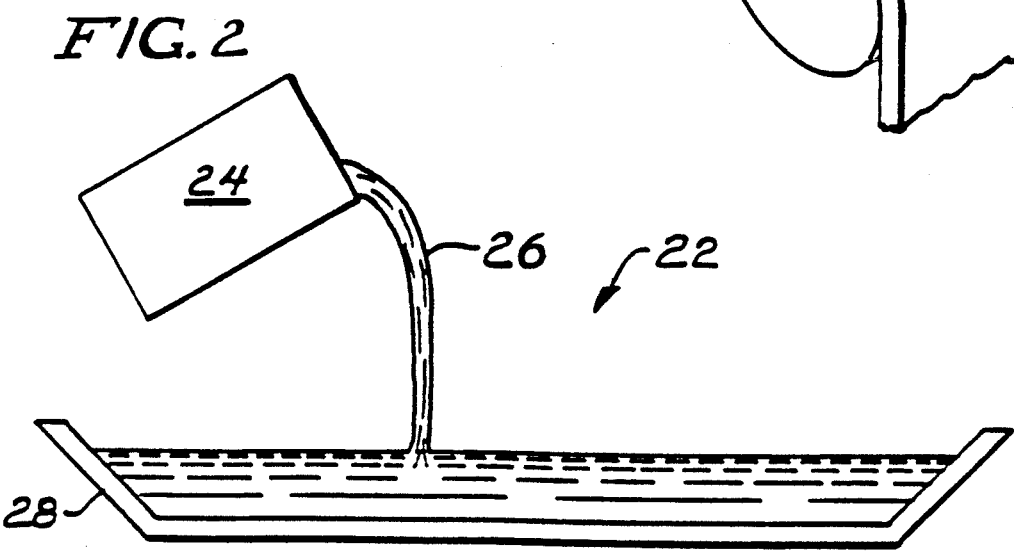
FIG. 2 is a simplified schematic diagram of a slip casting apparatus for use in the preferential orientation of the crystal particles of a metal oxide superconducting material in accordance with the present invention.

Referring to FIG. 2, there is shown another alternative approach which can be used for the preferential orientation of the individual crystal particles of the metal oxide powder. In the approach illustrated in FIG. 2, a slip casting arrangement 22 includes a plaster mold 28 into which a mixture 26 of the metal oxide powder crystals and a binder and solvent are poured from a container 24. The plaster mold 28 absorbs the binder and solvent leaving only the metal oxide crystals remaining in the plaster mold. Because of the plate-like shape of the individual crystals and their tendency not to remain in an on-end orientation, the crystal particles remaining in the plaster mold 28 are generally aligned in a flat orientation with their longer c-axis aligned generally vertically.

Figure 3:
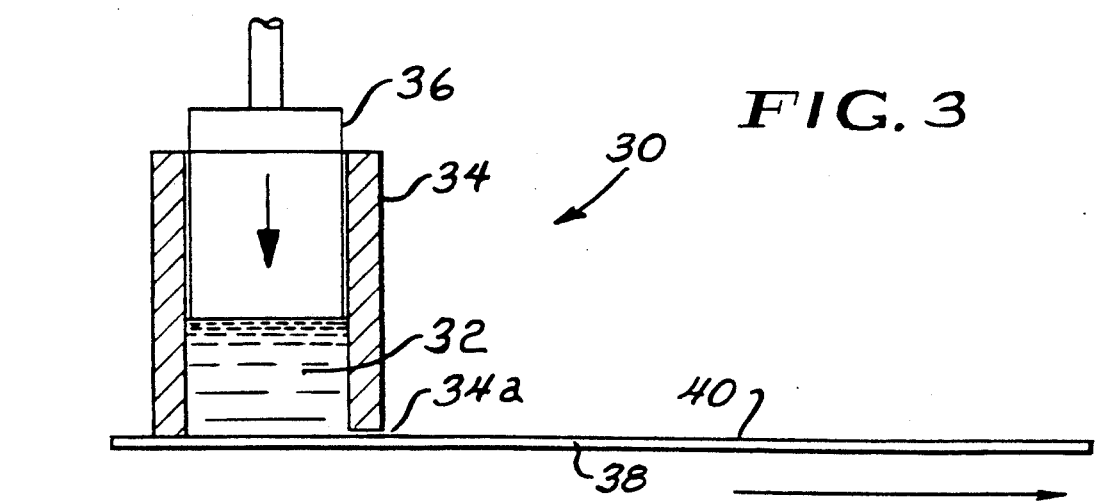
FIG. 3 is a simplified schematic diagram of an extrusion arrangement for use in the preferential orientation of the crystal particles of a metal oxide superconducting material in accordance with the present invention.

Referring to FIG. 3, there is shown yet another arrangement for orienting the metal oxide crystals along a preferential axis. In the approach of FIG. 3, an extrusion apparatus 30 includes a container 34 within which a partially dried slip containing the metal oxide powder 32 having a putty-like texture is disposed. The container 34 includes a small tapered aperture 34a on a lower portion thereof. The downward displacement of a pusher element 36 against the slip 32 within the container 34 forces the mixture out of the container's aperture 34a. The thus extruded metal oxide powder is in the form of a wire 40. This physics producing alignment in the tape casting techniques is the same in this technique and hence one can expect orientation using extrusion as well.

In accordance with the present invention, an acoustic plane wave, or a pressure wave, is applied to a dispersion in liquid of superconducting metal oxide powder crystals which may be produced by any one of the aforementioned techniques. However, the present invention does not require the fabrication of the powder dispersed in liquid by one of the above-described procedures as these represent only several ways in which the powder-liquid mixture could be formed. The pressure wave is applied to the powder-liquid mixture before it is sintered to a ceramic form. The manner in which a pressure wave orients crystal particles along a preferred direction is discussed in the following paragraphs. In this discussion, the metal oxide crystal particles are considered to be in the form of flat discs which closely approximates their actual configuration.

As described in "Theories of Birefringence" by N. C. Hilyard and H. C. Jerrard, Journal of Applied Physics, Vol. 33, No. 12, pp. 3470-3479, Dec. 1962, acoustic double refraction has been observed in solutions of nonspherical particles for frequencies between 2540 and 5240 kHz and with vanadium pentoxide in water and glycerin for both progressive and standing waves. Pronounced relaxation effects were observed.

Assuming that because of the radiation pressure set up in a solution by the passage of acoustic waves, colloidal particles or large molecules are subjected to a turning torque that attempts to align them with respect to the acoustic field. They in fact behave as Rayleigh discs. The distribution of the particles was obtained by considering the potential energy resulting from the torque.

Figure 4:
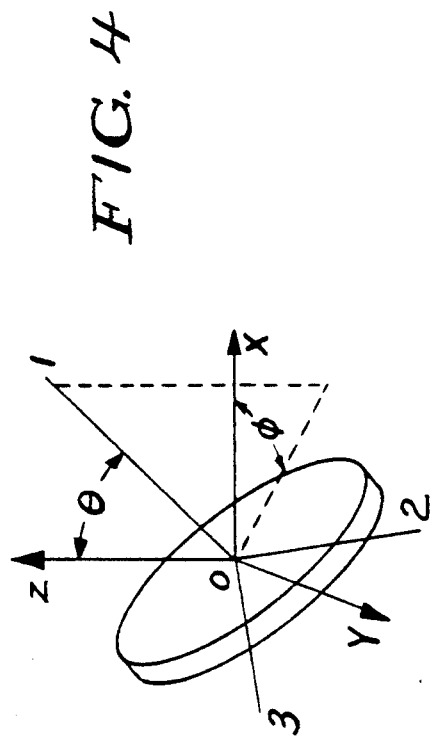
FIG. 4 illustrates the orientation of a crystal particle of metal oxide superconducting material in accordance with the present invention.

Another approach has considered the solution to be monodisperse and assumed the particles to be identical, uncharged, rigid, homogeneous ellipsoids of revolution which, if an appropriate value is taken for the axial ratio, may be considered as thin discs as shown in FIG. 4. Only dilute solutions were treated so that interacting forces were negligible. The axes of the ellipsoid were taken to coincide with the directions of principal polarizabilities. The forces acting on the particles were taken to be the time average torque M tending to orientate them and the force due to Brownian motion. By application of Debye's theory, the number of particles which at a given time have their major axis 01 in a solid angle $d\Omega$ is $Fd\Omega$, where the distribution function F is given by $$R \frac{\partial F}{\partial t} = \frac{1}{\sin\theta} \frac{\partial}{\partial \theta} \left[ \sin\theta \left( kT \frac{\partial F}{\partial \theta} - MF \right) \right]. \tag{1}$$

In this equation R is the moment required to give the particle unit angular velocity about an axis perpendicular to 01. It is related to the rotary diffusion constant D by $D = kT/R$, where k and T are Boltzmann's constant and the absolute temperature, respectively. If, due to the torque $\overline{M}$, the particle acquires a potential U, then $$M = R\partial\theta/\partial t = -\partial U/\partial \theta. \tag{2}$$

In the steady state, $\partial F/\partial t = 0$, so by Eq. (1), $$kT(\partial F/\partial\theta) = MF = -(\partial U/\partial\theta)F \tag{3}$$

whence $$F = C'e^{-U/kT} \tag{4}$$

The constant $C'$ is determined by assuming that $\int Fd\Omega = 1$. In order to determine F it is necessary to find a value for $\overline{M}$, by King. For a disc of radius a, volume V and density $\rho_1$ in a liquid of density $\rho_0$ subjected to a plane standing acoustic wave with a given velocity field, then provided $2\pi a <<$ the acoustic wavelength $\lambda$, $$M = -\frac{3}{2} \rho_0 a^3 A^2 \sin 2\theta \; [K \sin^2 kz - L \cos^2 kz]. \tag{5}$$

where $$K = \frac{m(5 + 2k^2 a^2 \cos^2\theta)}{5m + m_o(5 + k^2 a^2)}$$

and $$L = \frac{2}{15} \frac{I_1 k^2 a^2 \cos 2\theta}{I_1 + I_o}.$$

The negative sign indicates that $\overline{M}$ tends to reduce $\theta$. $z$ is the distance from a node, m is the mass of the particle minus the mass of liquid displaced, and $m_o$, $I_1$, and $I_o$ are given by $$m_o = (8/3)\rho_o a^3, \quad I_o = (2/15) m_o a^2, \quad I_1 = \tfrac{1}{2} m a^2.$$

The values of $\overline{M}$ at a velocity node ($z=0$) and a velocity antinode ($z=\lambda/4$), respectively, are given by $$M_m = (2L/3)\rho_o a^3 A^2 \sin 2\theta$$

and $$M_a = -(2K/3)\rho_o a^3 A^2 \sin 2\theta,$$

so that $$\left|\frac{M_m}{M_a}\right| = \frac{L}{K} \frac{(ka)^2}{15} \frac{4\pi^2 a^2}{15\lambda^2}.$$

This means that $\overline{M}_a$ is predominant and if $(ka)^2$ is small, it is given by $$M_a \quad \tfrac{2}{3}\rho_o a^3 A^2 \ (m/m + m_o) \sin 2\theta$$

This torque also applied to a disc in a progressive wave. The energy density $\overline{E}$ of the acoustic field may be introduced so that $$M_m = \frac{4}{3} a^3 E(m_a/m + m_o) \sin 2\theta \qquad (6)$$

$$= -B \sin 2\theta \qquad (7)$$

where, if V is the volume of the disc, $$B = 4a^2 E\left[\frac{V(\rho_1 - \rho_o)}{3V(\rho_1 - \rho_o) + 8\rho_o a^3}\right] \qquad (8)$$

and if the thickness of the disc is t then $V = \pi a^2 t$. By Eqs. (2) and (8).

$$U = \int B \sin 2\theta = -\tfrac{1}{2} B \cos 2\theta + C, \qquad (9)$$

where C is a constant and U has a minimum value of $C - B/2$ when $\theta = 0$ or $\pi/2$ according to whether $B > 0$ or $B < 0$, respectively. Thus on the application of the field the disk attempts both in a progressive and a standing wave to attain this orientation. It is opposed by thermal motion so that a temperature dependent equilibrium is established with a distribution function determined by Eqs. (4) and (9).

Figure 5:
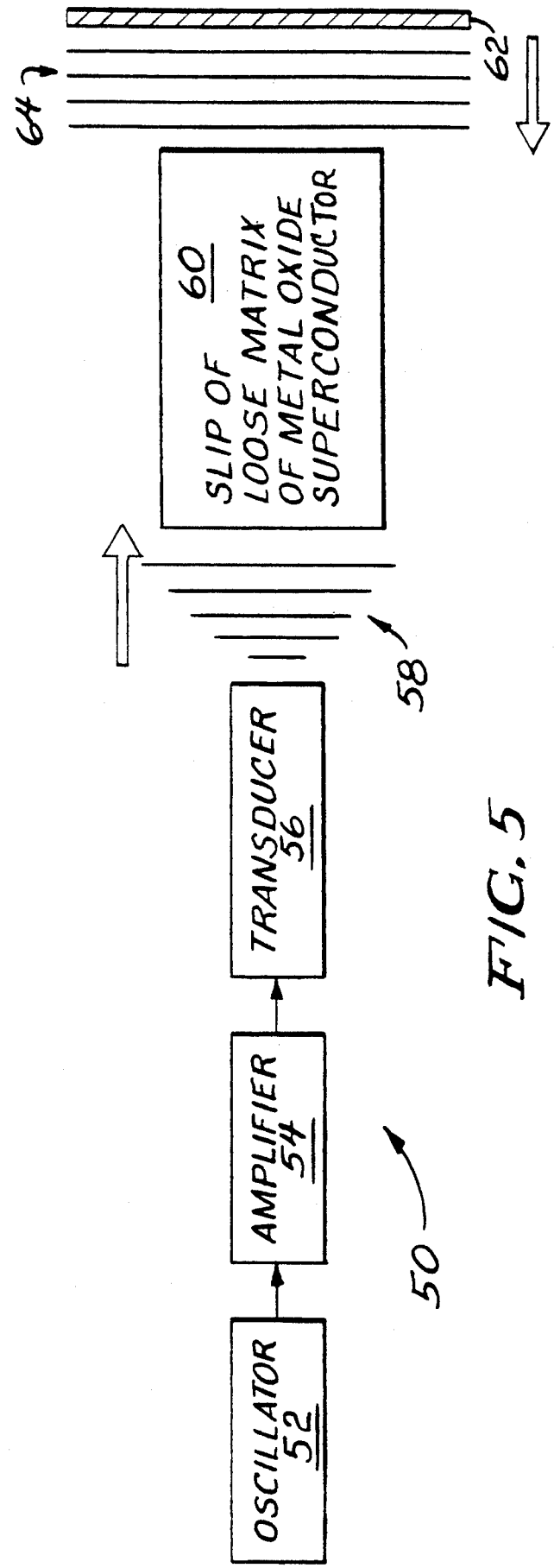
FIG. 5 is a simplified schematic diagram of an arrangement for applying an acoustic plane wave to a superconducting metal oxide ceramic slip in accordance with the present invention.

Referring to FIG. 5, there is shown in simplified schematic diagram form a pressure wave generating arrangement 50 for directing a pressure wave upon a slip 60 of metal oxide superconducting crystals dispersed in a liquid for orienting the crystal particles along a preferred direction. The pressure wave generating arrangement 50 includes an oscillator 52 which generates and provides an alternating signal to an amplifier 54. Amplifier 54 amplifies the alternating output of the oscillator 52 for driving a transducer 56 which converts the electric signal to a pressure wave 58 which is directed onto the powder-liquid slip 60 of the metal oxide superconducting crystal particles. The pressure waves 58 travel in the direction of the upper arrow in FIG. 5 and align the crystal particles within the slip 60 along a preferred direction. The arrangement of FIG. 5 further includes a wave reflector 62 which reflects the incident pressure waves and directs them back in the form of a reflected pressure wave 64 in the direction of the lower arrow in FIG. 5. By positioning the slip 60 between the transducer 56 and the reflector 62, a standing pressure wave is established across the slip of the metal oxide superconductor in applying a greater torque to the crystal particles for orienting them along a preferred direction.

The slip 60 of the metal oxide superconducting crystal particles is comprised of a solvent and a dispersing agent within which the crystal particles are dispersed. An example of a solvent for use in forming the slip 60 is xylene butyl alcohol. An example of a dispersing agent for use in the powder dispersed in liquid slip is the phosphate esther Emphos PS-21A which prevents clumping of the crystal particles by causing the individual particles from making intimate contact with one another. The liquid portion of slip 60 of the metal oxide superconducting crystal particles may be removed by either evaporation or by depositing the slip into a plaster mold which absorbs the liquid. After the liquid is removed from the slip 60, the metal oxide superconductor is converted to ceramic form by sintering.

There has thus been shown an improved metal oxide superconducting material with enhanced current-carrying capability. The metal oxide material is comprised of a powder wherein each of the particles is a single crystal having an orthorhombic structure and an anisotropic conductive characteristic. Each of the crystals is aligned along a preferential direction such that the desired direction of current conduction is aligned with the high critical current layers of the superconductor crystal structure. The application of a plane pressure wave to a slip of the metal oxide crystal particles causes the preferential orientation of the individual metal oxide crystals along a common axis.

While particular embodiments of the present invention have been shown and described, it will be obvious to those skilled in the art that changes and modifications may be made without departing from the invention in its broader aspects. For example, while the present invention is described in terms of a superconducting crystal powder comprised of yttrium barium copper oxide, this invention contemplates a superconducting material comprised of virtually any rare earth metal oxide having a crystal structure such as orthorhombic which possesses an anisotropic superconducting characteristic. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A method of forming a superconducting metal oxide with improved current carrying capacity wherein said superconducting metal oxide has a polycrystalline structure and is anisotropically superconducting having one or more longer crystal axes along which said metal oxide is superconducting, said method comprising the steps of:

reducing the superconducting metal oxide to a flake-like, powder form, wherein the metal oxide powder is comprised of particles of single crystals;

mixing said metal oxide crystal powder with a liquid so as to form a dispersion of said metal oxide crystals in the liquid;

generating a plane pressure wave in a spaced manner from said metal oxide powder;

directing said plate pressure wave onto a surface of the metal oxide powder in orienting said metal oxide single crystal particles along a preferential direction such that said one or more longer axes of each of said metal oxide crystals are in general alignment;

removing the liquid from the aligned metal oxide crystals; and sintering said metal oxide crystals in converting the superconducting metal oxide to a ceramic form.

2. The method of claim 1 wherein said liquid includes a solvent and a dispersing agent.

3. The method of claim 2 wherein said solvent is an alcohol.

4. The method of claim 2 wherein said dispersing agent is a phosphate ester.

5. The method of claim 1 wherein the plane pressure wave is in the sonic frequency range.

6. The method of claim 1 wherein the plane pressure wave is in the ultrasonic frequency range.

7. The method of claim 1 further comprising the step of reflecting the plane pressure wave back onto the metal oxide powder after the plane pressure wave initially transits the metal oxide powder in directing a standing plane pressure wave onto the metal oxide powder.

8. The method of claim 1 wherein the step of removing the liquid from the aligned metal oxide crystals includes heating said metal oxide crystals dispersed in said liquid after said metal oxide crystals are aligned.

9. The method of claim 1 wherein the step of removing the liquid from the aligned metal oxide crystals includes allowing the liquid to evaporate from said metal crystal and liquid mixture after said metal oxide crystals are aligned along said preferential direction.

10. The method of claim 1 further comprising the step of mechanically working the metal oxide crystal powder and liquid mixture in forming a slip of said metal oxide crystals.

11. The method of claim 10 wherein the step of mechanically working the metal oxide crystal powder and liquid mixture includes tape casting the mixture.

12. The method of claim 10 wherein the step of mechanically working the metal oxide crystal powder and liquid mixture includes slip casting the mixture.

13. The method of claim 10 wherein the step of mechanically working the metal oxide crystal powder and liquid mixture includes extruding the mixture.

* * * * *

UNITED STATES PATENT AND TRADEMARK OFFICE
CERTIFICATE OF CORRECTION

PATENT NO. : 5,045,528

DATED : September 3, 1991

INVENTOR(S) : Thomas L. Tolt and Roger B. Poeppel

It is certified that error appears in the above-identified patent and that said Letters Patent is hereby corrected as shown below:

| | |
|---|---|
| Column 1, Line 47, | after "bundles" cancel the semi-colon (;) and insert a comma (,); |
| Column 2, Line 35, | cancel "ar" and insert -- are --; |
| Column 2, Line 55, | cancel "liquid ," and insert -- liquid, --; |
| Column 3, Line 52, | cancel "plane ," and insert -- plane, --; |
| Column 4, Line 26, | cancel "C." and insert -- C --; |
| Column 4, Line 64, | cancel "C." and insert -- C --; |
| Column 6, Line 47, | cancel "M" and insert -- $\overline{M}$ --; |
| Column 6, Line 51, | cancel "MF" and insert -- $\overline{MF}$ --; |
| Column 6, Line 55, | cancel "Ce" and insert -- C'e --; |
| Column 6, Line 65, | cancel "M" and insert -- $\overline{M}$ --; |
| Column 7, Line 20, | cancel "Mm" and insert -- $\overline{M}$m --; |
| Column 7, Line 23, | cancel "Ma" and insert -- $\overline{M}$a --; |

UNITED STATES PATENT AND TRADEMARK OFFICE
CERTIFICATE OF CORRECTION

PATENT NO. : 5,045,528

DATED : September 3, 1991

INVENTOR(S) : Thomas L. Tolt and Roger B. Poeppel

It is certified that error appears in the above-identified patent and that said Letters Patent is hereby corrected as shown below:

Column 7, Line 27, cancel "$\mathrm{Mm}\brack\mathrm{Ma}$" and insert --$\left[\mathrm{Mm}\atop\mathrm{Ma}\right]$--.

Signed and Sealed this

Ninth Day of November, 1993

BRUCE LEHMAN

*Attest:*

*Attesting Officer*          *Commissioner of Patents and Trademarks*